United States Patent
Chen et al.

(10) Patent No.: US 7,924,039 B2
(45) Date of Patent: Apr. 12, 2011

(54) SELF-CLEANING PACKAGE TESTING SOCKET

(75) Inventors: Te Wei Chen, Hsinchu (TW); Kuan Chin Lu, Hsinchu (TW)

(73) Assignee: King Yuan Electronics Co., Ltd., Hsinchu (TW)

( * ) Notice: Subject to any disclaimer, the term of this patent is extended or adjusted under 35 U.S.C. 154(b) by 12 days.

(21) Appl. No.: 12/591,457

(22) Filed: Nov. 20, 2009

(65) Prior Publication Data

US 2011/0018570 A1 Jan. 27, 2011

(30) Foreign Application Priority Data

Jul. 22, 2009 (TW) .............................. 98124695 A

(51) Int. Cl.
*G01R 31/02* (2006.01)
(52) U.S. Cl. ................................................. 324/755.01
(58) Field of Classification Search .................. 324/765, 324/763, 760, 158.1; 439/66–68, 482, 169, 439/174, 912, 259, 73, 331; 257/48; 438/14–18
See application file for complete search history.

(56) References Cited

U.S. PATENT DOCUMENTS

| 7,068,059 B2 * | 6/2006 | Hanke et al. ................... 324/765 |
| 7,696,770 B2 * | 4/2010 | Binette et al. .................. 324/765 |
| 7,701,200 B1 * | 4/2010 | Fahrner et al. ............. 324/158.1 |

* cited by examiner

*Primary Examiner* — Ha Tran T Nguyen
*Assistant Examiner* — Tung X Nguyen
(74) *Attorney, Agent, or Firm* — Bacon & Thomas, PLLC

(57) ABSTRACT

The present invention relates to a self-cleaning package testing socket, which comprises a base plate, a surround wall is configured on the periphery of the base plate and surrounding with a central testing tank inside. Two transversal channels respectively disposed at two opposite sides of the surround wall. Each transversal channel comprises a nozzle tube between inlet and outlet; the nozzle tube radially connects two bypass pipes. Herewith, the testing tank through the bypass pipes connected to the nozzle tubes of the transversal channels. Hence, when passing air into one end of the each transversal channel, it will cause the airflow rate inside the nozzle tube to speed up, so that the pressure inside the bypass pipes will reduce, and the testing tank results a vacuum-clean effect. Therefore, the present invention can be on-line self-cleaning the test socket.

8 Claims, 3 Drawing Sheets

SELF-CLEANING PACKAGE TESTING SOCKET

BACKGROUND OF THE INVENTION

1. Field of the Invention

The present invention relates to a self-cleaning package testing socket, and more particularly to a testing socket for placing package when performing electrical tests.

2. Description of Related Art

In the process of semiconductor package test, the integrated circuit chip is packaged into a package after the packaging process, and then places the package into the testing socket for performing electrical tests to test whether the functions are normal or not, and whether the characteristics fit with the customer's requirements or not.

However, it inevitably adheres dust or impurities when picking-and-placing or transporting the packages. Moreover, it also inevitably generates particles or debris by colliding when placing into or picking out from the testing socket. In this regard, the dust, impurities, particles, or debris will continuously gather in the testing socket after a long-term usage. Consequently, it will result in a contact fault between the pogo pins of the testing socket and the package so that affect the testing results.

Accordingly, the conventional process must shut down after a certain period to clean the testing socket. However, the conventional cleaning method is complex and inconvenient, such as it must disassemble the tester head at first, and then disassemble the base of the testing socket, and finally disassemble the testing socket to begin cleaning. Moreover, the conventional method for cleaning is using a manual way, which utilizes a brush to clean along with compressed air. After the cleaning process, it still needs to assemble the testing socket as its original form via a reversed way according to the above steps, and the testing socket may continue to produce products only if the testing socket installing correctly by a confirmation process.

Therefore, the conventional cleaning method for the testing socket is not only waste much time and human labors, but also the yield rate of production decreased because of shutting down the test bench. In addition, the complex and inconvenient processes of disassemble and install the testing socket is easier to damage the test bench since the negligence of the worker. Moreover, use the brush and the compressed air to clean the testing socket will cause the difficulties of quantification and standardization of operations.

SUMMARY OF THE INVENTION

An object of the present invention is to provide a self-cleaning package testing socket, comprising: a holding stage, a test port, and an air pressure source. The holding stage includes a base plate and a surround wall where a plurality of through holes provided in the center of the base plate. The surround wall configured on the periphery of the base plate and surrounding with a central testing tank inside, the surround wall provides at least one transverse channel. The at least one transverse channel includes an inlet and an outlet which respectively penetrates through two side surfaces of the surround wall. The at least one transverse channel further provides with a nozzle tube between the inlet and the outlet, the nozzle tube further radially extending with at least one bypass pipe, thereby the at least one transverse channel is communicated with the testing tank through the nozzle tube and the at least one bypass pipe.

Moreover, a test port is disposed at the testing tank, the test port includes a plurality of electrical contacts which correspondingly received in the plurality of through holes of the base plate respectively and electrically connected to a testing device and electrically contact a package to be tested respectively. However, an air pressure source is communicated with one of the inlet and the outlet of the at least one transverse channel of the holding stage. Thus, when airflow passing through the nozzle tube, it will cause the airflow rate inside the nozzle tube to speed up, so that the pressure inside the bypass pipes will reduce, and the testing tank results a vacuum-clean effect to clean particles or dust in the testing tank. Therefore, the present invention is capable of on-line cleaning the test socket, it does not need to shutdown or suspend the process, so that the yield rate of production will be raised and the cost will be reduced.

Further, the present invention may comprises a guiding seat and at least one inner tube, wherein the guiding seat is received in the testing tank, the guiding seat includes a central through hole and at least one bypass passage. The at least one inner tube is inserted in the at least one bypass pipe and the at least one bypass passage to communicate therewith, so the at least one inner tube is communicated with the at least one bypass pipe of the at least one transverse channel and the central through hole. The at least one bypass pipe may use a diameter shrinking tube, and the open of the diameter shrinking tube preferably located at a side near the central through tank, so that it will produce a stronger suction for the central through tank. Additionally, the guiding seat may include at least one guiding inclined plane adjacent to the central through hole. Thus, a package to be tested can be guided through the guiding seat so that the package to be tested can be placed accurately into the central through hole and correspondingly contact the test port for testing.

Moreover, the guiding seat may further include at least one upper through hole on the upper surface of the guiding seat, the at least one upper through hole downwardly communicates with the at least one bypass passage. Hence, the present invention is not only capable of cleaning foreign dust, particles or debris in the central testing tank, but also to clean the upper surface of the guiding seat, and further to prevent the foreign dust, particles or debris to affect the results of test. Besides, the air pressure source of the present invention is a high-pressure source or a vacuum source, and it can be blowing or suction operation.

Furthermore, the test port of the present invention may further comprise a fixture seat which may comprises a plurality of holes, the plurality of electrical contacts respectively received and mounted in the plurality of holes. Based on it, the fixture seat of the present invention is used to fix the plurality of electrical contacts for preventing the package to be tested can not be correspondingly contacted to the plurality of electrical contacts accurately due to bending or displacement thereof.

Among which, the plurality of electrical contacts of the present invention may comprises a plurality of pogo pins. In addition, the at least one transverse channel may includes two transverse channels correspondingly in parallel disposed at two opposite sides of the central testing tank of the holding stage. Based on it, it is capable of resulting vacuum-clean effects on both corresponding sides of the testing tank at the same time. Of course, the two transverse channels may dispose at the adjacent sides and form L-shaped channel, or four transverse channels instead dispose at the four sides of the testing tank to clean foreign dust, particles or debris on the four sides of the testing tank at the same time to achieve the better cleaning effect.

DETAILED DESCRIPTION OF THE PREFERRED EMBODIMENTS

Figure 1:
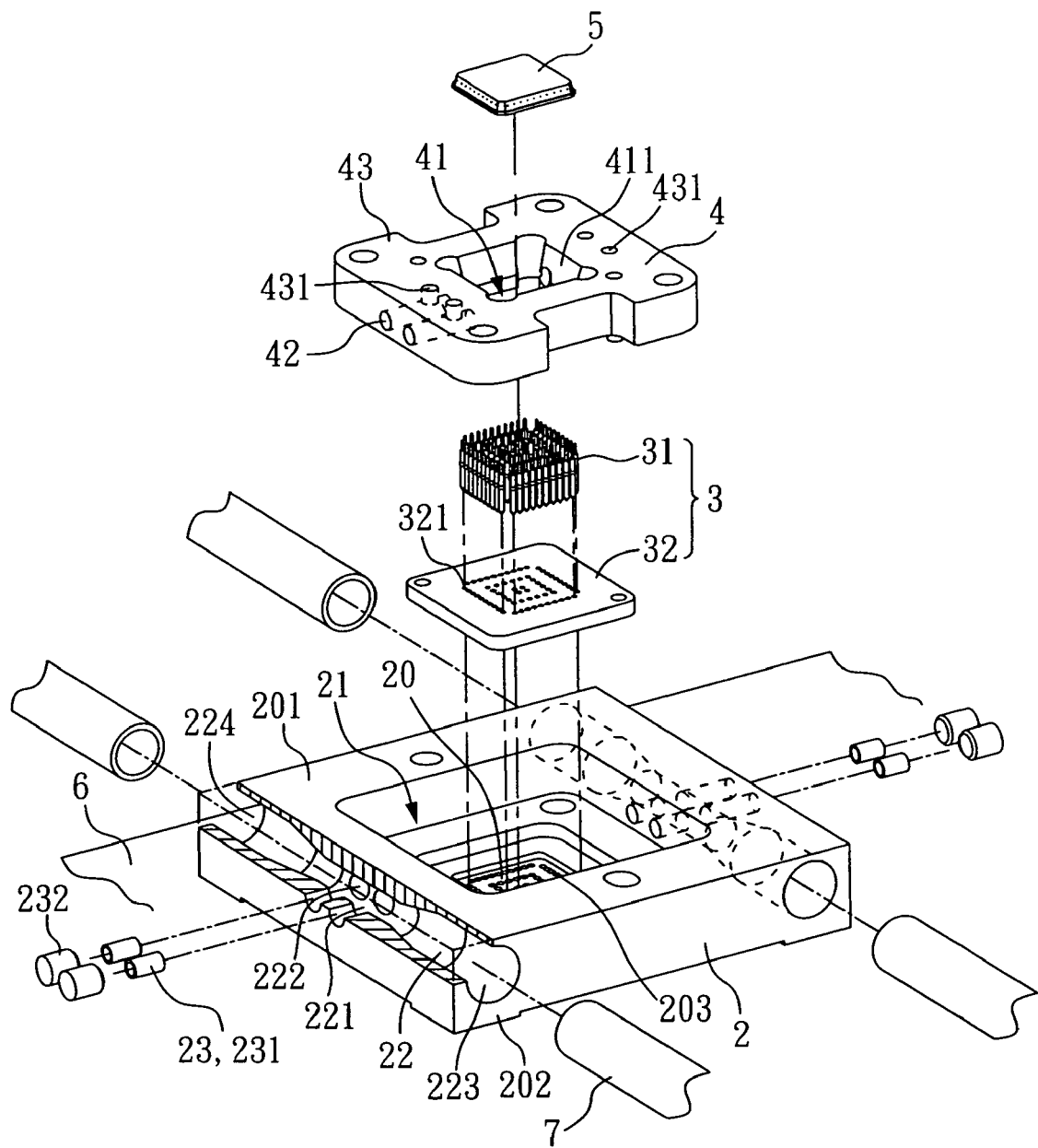
FIG. 1 is an exploded view diagram of the first preferred embodiment of the present invention.
Figure 2:
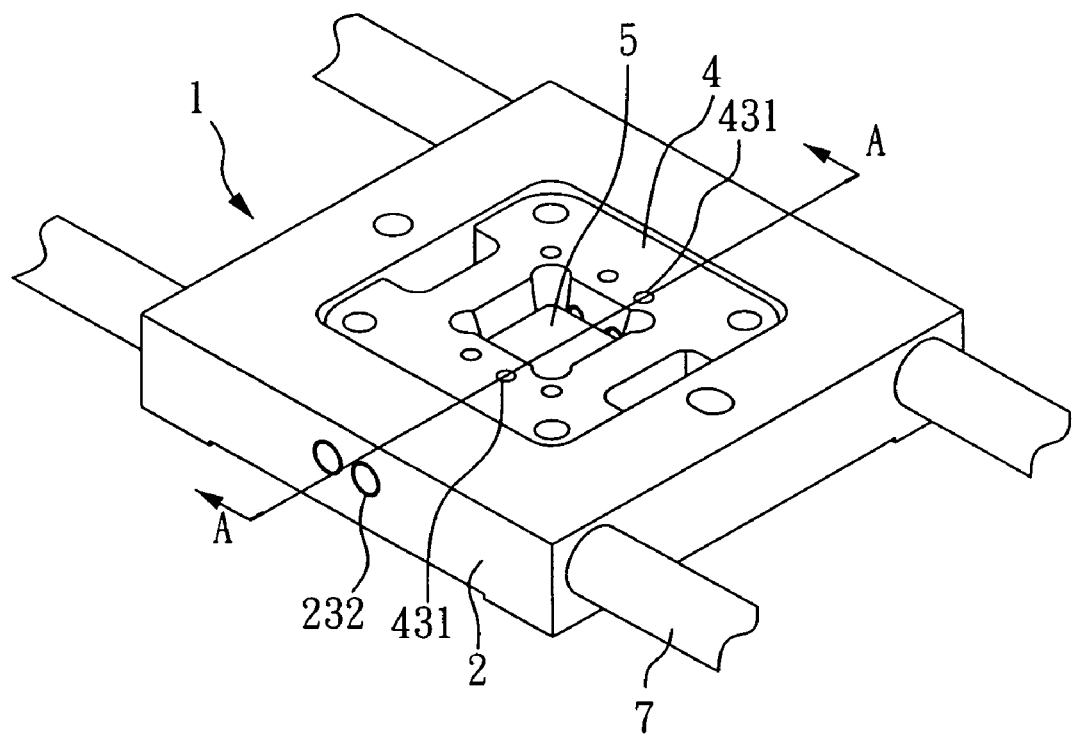
FIG. 2 is a three-dimensional diagram of the first preferred embodiment of the present invention.
Figure 3:
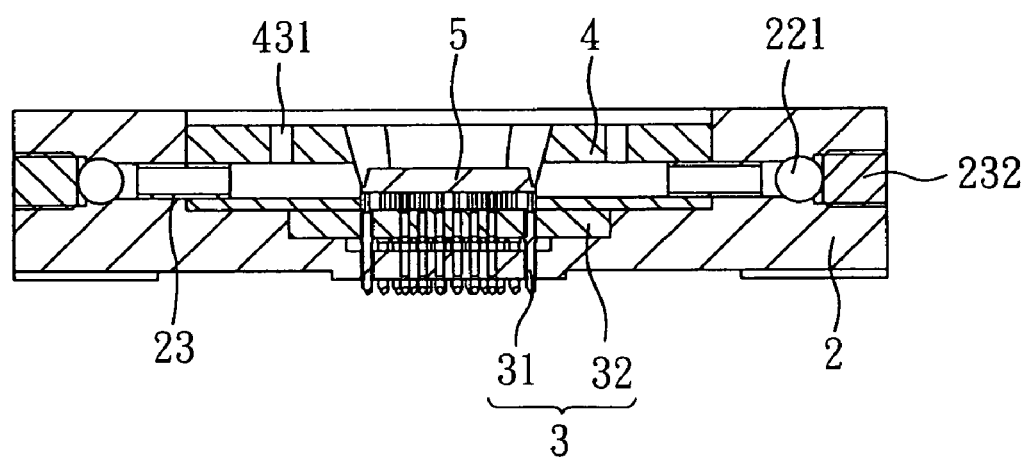
FIG. 3 is a cross-sectional view taken generally along line A-A according to a first preferred embodiment of the present invention.

Please refer to FIG. 1 and FIG. 2 together with FIG. 3. FIG. 1 is a exploded view diagram of the first preferred embodiment of the present invention. FIG. 2 is a three-dimensional diagram of the first preferred embodiment of the present invention. FIG. 3 is a cross-sectional view taken generally along line A-A according to a first preferred embodiment of the present invention. As shown in the figures, a self-cleaning package testing socket of the present invention is used to electrically connect to a testing device 6 and a package to be tested 5, and mainly used in semiconductor packaging and testing process to test if functions and characteristics of the package to be tested 5 are normal. The figures show a holding stage 20, includes a base plate 20 and a surround wall 201. Among which, a plurality of through holes 203 are provided in the center of the base plate 20, and the surround wall 201 is configured on the periphery of the base plate 20 and surrounding with a central testing tank 21 inside.

In addition, the surround wall 201 respectively provides two transverse channels 221 that are disposed at two sides of the testing tank 21 and the two transverse channels are parallel to each other. Each transverse channel 22 includes an inlet 223 and an outlet 224, which respectively penetrates through two side surfaces 202 of the surround wall 201. Also, each transverse channel further provides a nozzle tube 221 between the inlet 223 and the outlet 224. Besides, each nozzle tube 221 further radially extends with two bypass pipes 222, thereby the transverse channels 22 are communicated with the testing tank 21 through the nozzle tubes 221 and the bypass pipes 222.

Moreover, the figures show a guiding seat 4 and inner tubes 23. The guiding seat 4 is received in the testing tank 2, and the guiding seat 4 includes a central through hole 41 and two bypass passages 42 disposed at two corresponding sides of the central through hole 41. The inner tubes 23 are inserted in the bypass pipes 222 and the bypass passage 42, and sealed with the surface 202 of the surround wall 201 through a plug 232. Thus, the inner tubes 23 are communicated between the nozzle tubes 221 of the transverse channels 22 and the central through hole 41 of the guiding seat 4. The inner tubes 23 are used to prevent leaking air flow from connecting gap of the guiding seat 4 and the testing tank 2. Furthermore, sides of the central through hole 41 are guiding inclined plane 411 to form a tapered central through hole 41 for guiding to pick or place the package to be tested 5 conveniently.

Also, in the present embodiment, a plurality of upper through holes 431 are provided on the upper surface 43 of the guiding seat 4. In other words, an upper through hole 431 is provided correspondingly on a bypass passage 42, and the upper through hole 431 downwardly communicates with the bypass passage 42. Hence, the present embodiment is not only capable of cleaning foreign dust, particles or debris in the testing tank 21 or the central through hole 41, but also to clean the upper surface 43 of the guiding seat 4 through the upper through hole 431, and further to prevent the foreign dust, particles or debris to affect the results of test.

Furthermore, the figures show a test port 3 is disposed in the testing tank 21. Among which, the test port 3 includes a plurality of electrical contacts 31 which correspondingly received in the plurality of through holes 203 of the base plate 20 respectively, and the test port 3 is used to electrically connect to a testing device 6 and electrically contact a package to be tested 5. In the present embodiment, the plurality of electrical contacts comprises plural pogo pins. The figures further show a fixture seat 32, which comprises a plurality of holes 321, the plurality of electrical contacts 31 respectively penetrate and mount in the plurality of holes 321. Based on it, the fixture seat 32 is used to fix the plurality of electrical contacts 31 for preventing the package to be tested 5 can not be correspondingly contacted to the plurality of electrical contacts 31 accurately due to bending or displacement thereof.

Furthermore, an air pressure source 7 as shown in the figures is communicated with two end of the transverse channel 22, and the air pressure source 7 is a high-pressure source, of course it can be vacuum source also. Therefore, the present invention is utilizing Venturi effect resulted by the transverse channel 22 and the nozzle tube 221, when airflow passing through the nozzle tube 221, it will cause the airflow rate inside the nozzle tube 221 to speed up, so that the pressure inside the bypass pipes 222 will reduce, and the central through hole 41 and the upper surface 43 result a vacuum-clean effect. Accordingly, the present invention utilizes the Venturi effect to amplify suction, so that it does not need a high degree pressure source or vacuum source, it saving equipment costs, and will not produce noise.

Besides, in accordance with the specifications of products to be tested or the requirements of customers are different, and sometimes in need of high-temperature test, the temperature usually range from 75° C. to 105° C. At this time, the effect of the present invention is more remarkable, it due to the ideal gas theory, which is proportional to the relationship between temperature and pressure. In the present invention, the temperature of the testing tank 21 of the central through hole 41 is higher than other place, resulting in higher pressure, thus to achieve a better cleaning effect.

Figure 4:
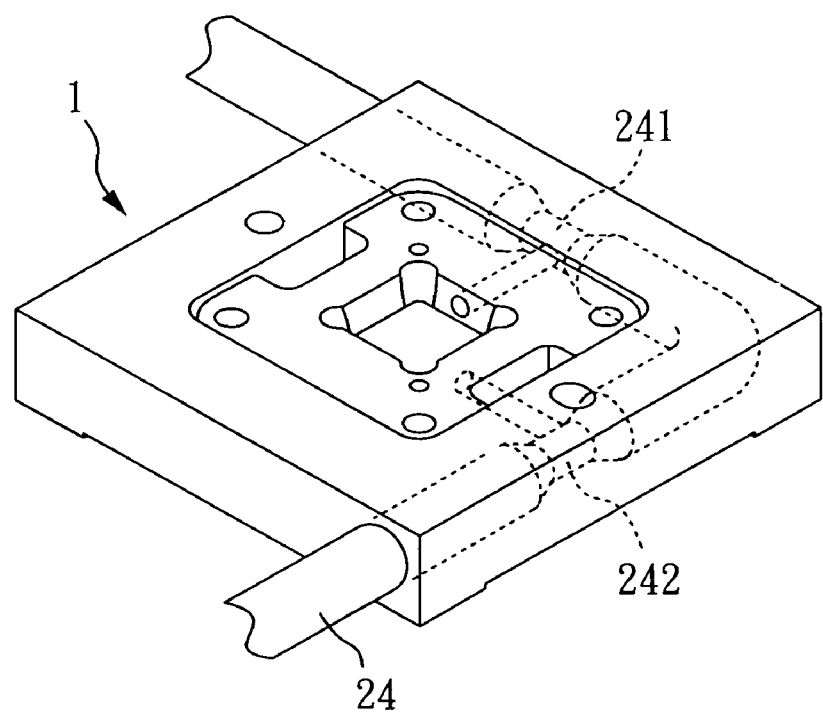
FIG. 4 is a three-dimensional diagram of the second preferred embodiment of the present invention.
Figure 5:
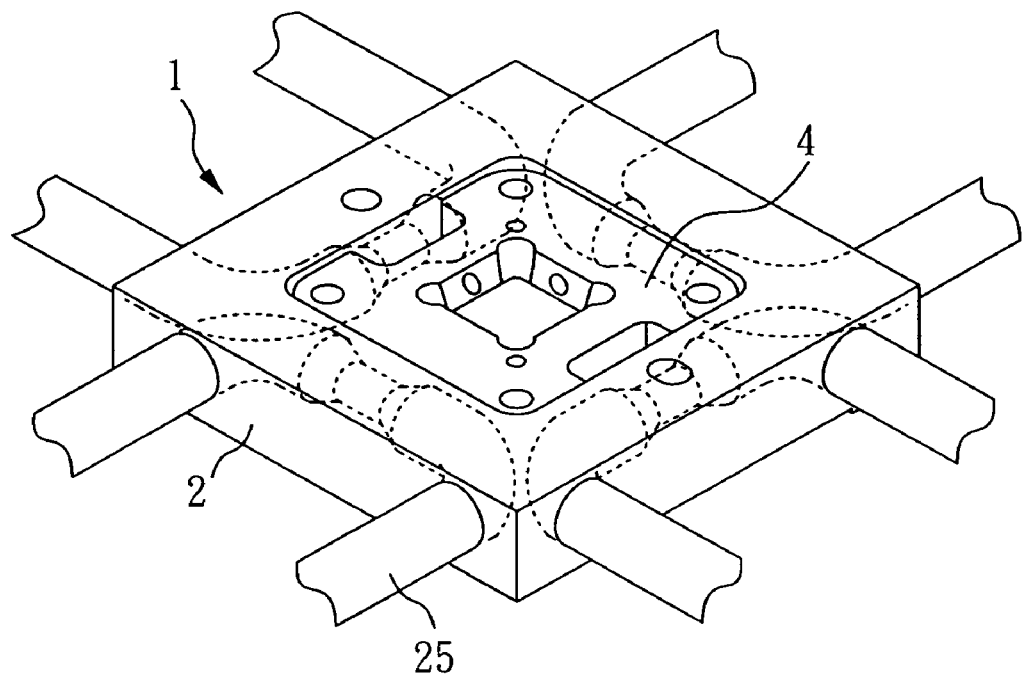
FIG. 5 is a three-dimensional diagram of the third preferred embodiment of the present invention.

Please refer to FIG. 4 together with FIG. 5. FIG. 4 is a three-dimensional diagram of the second preferred embodiment of the present invention. FIG. 5 is a three-dimensional diagram of the third preferred embodiment of the present invention. As shown in FIG. 4, the main difference between the second preferred embodiment and the first preferred embodiment is that a transverse channel 24 in the second preferred embodiment is a L-shaped channel, in which the two section respectively includes a central nozzle tube 241, 242 is disposed at the adjacent sides of the testing tank 21, therefore it is capable of providing vacuum-clean effects on the adjacent sides simultaneously. In addition, as shown in FIG. 5, the third preferred embodiment includes four transverse channels 25 disposed at the four sides of the testing tank 21 for providing vacuum-clean effects on the four sides simultaneously to achieve better cleaning effect. Consequently, the present invention may flexibly modify design according to actual demand in order to achieve the best cleaning effect.

Although the present invention has been explained in relation to its preferred embodiments, it is to be understood that many other possible modifications and variations can be made without departing from the scope of the invention as hereinafter claimed.

What is claimed is:

1. A self-cleaning package testing socket, comprising:
a holding stage, including a base plate, a surround wall and a plurality of through holes provided in the center of the base plate; the surround wall being configured on the periphery of the base plate and surrounding with a central testing tank inside, the surround wall providing at least one transverse channel, which including an inlet and an outlet respectively penetrating through two side surfaces of the surround wall; the at least one transverse channel further providing a nozzle tube between the inlet and the outlet, the nozzle tube further radially extending with at least one bypass pipe, thereby the at least one transverse channel is communicated with the testing tank through the nozzle tube and the at least one bypass pipe;
a test port, being disposed at the testing tank, the test port including a plurality of electrical contacts which correspondingly received in the plurality of through holes of the base plate respectively; and
an air pressure source, being communicated with one of the inlet and the outlet of the at least one transverse channel of the holding stage.

2. The self-cleaning package testing socket as claimed in claim 1, further comprises a guiding seat and at least one inner tube, wherein the guiding seat is received in the testing tank, the guiding seat includes a central through hole and at least one bypass passage, the at least one inner tube is inserted in the at least one bypass pipe and the at least one bypass passage to communicate therewith.

3. The self-cleaning package testing socket as claimed in claim 2, wherein the guiding seat further includes at least one guiding inclined plane adjacent to the central through hole.

4. The self-cleaning package testing socket as claimed in claim 2, wherein the guiding seat further includes at least one upper through hole provided on the upper surface of the guiding seat, the at least one upper through hole downwardly communicates with the at least one bypass passage.

5. The self-cleaning package testing socket as claimed in claim 1, wherein the test port further comprises a fixture seat, the fixture seat comprises a plurality of holes, the plurality of electrical contacts respectively are received and mounted in the plurality of holes.

6. The self-cleaning package testing socket as claimed in claim 1, wherein the plurality of electrical contacts comprise a plurality of pogo pins.

7. The self-cleaning package testing socket as claimed in claim 1, wherein the at least one transverse channel comprises two transverse channels correspondingly in parallel disposed at two opposite sides of the central testing tank of the holding stage.

8. The self-cleaning package testing socket as claimed in claim 1, wherein the air pressure source is a high-pressure source.

\* \* \* \* \*